United States Patent [19]
Wu

[11] Patent Number: 5,977,561
[45] Date of Patent: Nov. 2, 1999

[54] ELEVATED SOURCE/DRAIN MOSFET WITH SOLID PHASE DIFFUSED SOURCE/DRAIN EXTENSION

[75] Inventor: Shye-Lin Wu, Hsinchu, Taiwan

[73] Assignee: Texas Instruments - Acer Incorporated, Hsinchu, Taiwan

[21] Appl. No.: 09/033,526

[22] Filed: Mar. 2, 1998

[51] Int. Cl.[6] .................................................. H01L 29/76
[52] U.S. Cl. ........................ 257/67; 257/221; 257/410; 257/412; 257/650; 257/644
[58] Field of Search ............... 257/67, 440, 336, 257/344, 408, 410, 411, 412, 640, 649, 221, 66, 56, 71, 644, 650

[56] References Cited

U.S. PATENT DOCUMENTS

| | | | |
|---|---|---|---|
| 4,435,897 | 3/1984 | Kuroda et al. | 257/67 |
| 5,221,852 | 6/1993 | Nagai et al. | 257/221 |
| 5,793,059 | 8/1998 | Park | 257/67 |
| 5,796,151 | 8/1998 | Hsu et al. | 257/410 |

OTHER PUBLICATIONS

Kiyoshi Takeuchi et al., High performance sub–tenth micron CMOS using advanced boron doping and $WSI_2$ dual gate process, 1995 Symposium on VLSI Technology Digest of Technical Papers, pp. 9 and 10.

Shye Lin Wu et al., Suppression of Boron Penetration into an Ultra–Thin Gate Oxide ($\leq 7nm$) by Using a Stacked–Amorphous–Silicon(SAS) Film, 1993 IEEE, pp. 329–332.

T.P. Ong et al., CVD $SiN_x$ Anti–reflective Coating for Sub–$0.5\mu m$ Lithography, 1995 Symposium on VLSI Technology Digest of Technical Papers, pp. 73 and 74.

Tan Fu Lei et al., Low–Temperature Growth of Silicon–Boron Layer as Solid Diffusion Source for Polysilicon Contacted $p^+$–n Shallow Junction, 1995 IEEE, pp. 2104–2110.

Primary Examiner—Carl Whitehead, Jr.
Attorney, Agent, or Firm—Harness, Dickey & Pierce, P.L.C.

[57] ABSTRACT

The MOSFET has a stacked gate structure which has a first silicon layer, a second silicon layer, and a spacer structure. The first silicon layer is formed over the semiconductor substrate. The second silicon layer contains second type dopants and is formed on the first silicon layer. The spacer structure containing first type dopants is formed on the sidewall of the first silicon layer and the second silicon layer. A gate insulator layer is formed between the first silicon layer and the semiconductor substrate. The second silicon layer is also formed on the semiconductor substrate at a region uncovered by the stacked gate structure. A junction region is formed in the semiconductor substrate under the second silicon layer but not under the stacked gate structure. An extended junction is formed in the semiconductor substrate under the spacer structure.

21 Claims, 3 Drawing Sheets

5,977,561

ELEVATED SOURCE/DRAIN MOSFET WITH SOLID PHASE DIFFUSED SOURCE/DRAIN EXTENSION

FIELD OF THE INVENTION

The present invention relates to a semiconductor transistor and, more specifically, to an elevated source/drain MOSFET (metal oxide semiconductor field effect transistor) with solid phase diffused source/drain extension and a method of forming the MOSFET.

BACKGROUND OF THE INVENTION

From the first invention of integrated circuits in 1960, the number of devices provided on a chip has grown at an explosive rate. The technologies of the semiconductor industry have been researched continuously for almost four decades. The progress of the semiconductor integrated circuits has stepped into ULSI (ultra large scale integration) level or an even higher level. The capacity of a single semiconductor chip has increased from several thousand devices to hundreds of millions of devices, or even billions of devices. The integrated circuit devices like transistors, capacitors, and connections must be greatly narrowed simultaneously. The increasing packing density of the integrated circuits generates numerous challenges to the semiconductor manufacturing process. Every device needs to be formed within a smaller size without damaging the characteristics and the operations. The demands on high packing density, low heat generation, and low power consumption devices with good reliability and long operation life must be maintained without any degradation in their functions. These achievements are expected to be reached with the five key aspects of semiconductor manufacturing, including the photography, the etching, the deposition, the ion implantation, and the thermal processing technologies. The continuous increase in the packing density of the integration circuits must be accompanied by a smaller feature size. With the present semiconductor manufacturing technology, the processes with generally a quarter micrometer in size are widely utilized. For making the next generation devices, the technologies focus mainly on one-tenth micrometer and even nanometer feature sizes are highly required.

Transistors, or more particularly the metal oxide semiconductor field effect transistors (MOSFET), are the most important and frequently employed devices. The MOSFET is widely employed in the integrated circuits with its high performance. However, with the continuous narrowing of the device size, the sub-micron scale MOS transistors have to face many risky challenges. As the MOS transistors become narrower and thinner accompanying shorter channels, problems like junction punchthrough, leakage, and contact resistance cause the reduction in the yield and the reliability of the semiconductor manufacturing processes.

For developing future MOS devices with a sub-micrometer or even smaller feature size, the ultra shallow junctions are required to suppress the short channel effects encountered with the down-scaling of sizes. On the other hand, new challenges arise with a narrowed size. The preparation of an extremely shallow source/drain junction is very difficult. The conventional ion implantation process is unable to form a shallow junction with high dopant concentration. In the work proposed by K. Takeuchi et al. ("High performance sub-tenth micron CMOS using advanced boron doping and $WSi_2$ dual gate process", in 1995 Symposium on VLSI Technology Digest of Technical Papers), the problem is addressed. The ion implantation is hard to form shallow and high concentration source/drain. The defect-induced anomalous diffusion of boron in the channel region becomes a problem. Local boron depletion near the source/drain junctions will directly enhance short channel effects. A CMOS fabrication method is also disclosed in their work.

In addition, a device degradation problem is found to come from the boron penetration into the thin gate oxide with the formation of a doped polysilicon gate. S. L. Wu (the inventor of the present invention), C. L. Lee, and T. F. Lai address the problem in their work "Suppression of Boron Penetration into an Ultra-Thin Gate Oxide ($\leq 7$ nm) by Using a Stacked-Amorphous-Silicon (SAS) Film" (IEDM-93, p.329, 1993 IEEE). The p+ polysilicon has been widely used as the gate material of pMOSFET to avoid the short-channel effects. The $BF_2$-implant is typically used in forming both the gate and the junction. However, the F-incorporation will enhance the boron penetration through the thin gate oxide into the silicon substrate. The penetration also results in a large threshold voltage shift. A SAS gate structure is proposed to suppress the F-incorporation-induced boron penetration effect in their work.

SUMMARY OF THE INVENTION

An elevated source/drain MOSFET (metal oxide semiconductor field effect transistor) with solid phase diffused source/drain extension is disclosed in the present invention. The short channel effects can be suppressed by using an elevated junction. An extended ultra-shallow source/drain junction is formed by using a spacer structure as a diffusion source. The effects accompanying the small feature size devices are eliminated by the extended ultra-shallow junction.

The structure of the transistor on a semiconductor substrate in the present invention is as follows. The transistor has a stacked gate structure over the semiconductor substrate. The stacked gate structure has a first silicon layer, a second silicon layer, and a spacer structure. The first silicon layer is formed over the semiconductor substrate and the second silicon layer containing second type dopants is formed over the first silicon layer. The spacer structure containing first type dopants is on the sidewall of the first silicon layer and the second silicon layer. The transistor further has a gate insulator layer between the first silicon layer and the semiconductor substrate. The second silicon layer is also formed on the semiconductor substrate at a region uncovered by the stacked gate structure. The transistor has a junction region and an extended junction region. The junction region is in the semiconductor substrate under the second silicon layer but not under the stacked gate structure. The extended junction region is in the semiconductor substrate under the spacer structure.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PROFFERED EMBODIMENT

An elevated source/drain MOSFET (metal oxide semiconductor field effect transistor) with solid phase diffused source/drain extension is provided in the present invention. An elevated source/drain junction is formed through the deposition of a second silicon layer as a diffusion source. The short channel effects are suppressed by using the elevated junction. A stacked silicon layer structure is utilized as the gate structure. The boron penetration problem is minimized with the protection of a shield layer. An extended ultra-shallow source/drain junction is formed by using a spacer structure as a diffusion source. The hot electron effect is eliminated by the extended ultra-shallow junction.

Figure 1:
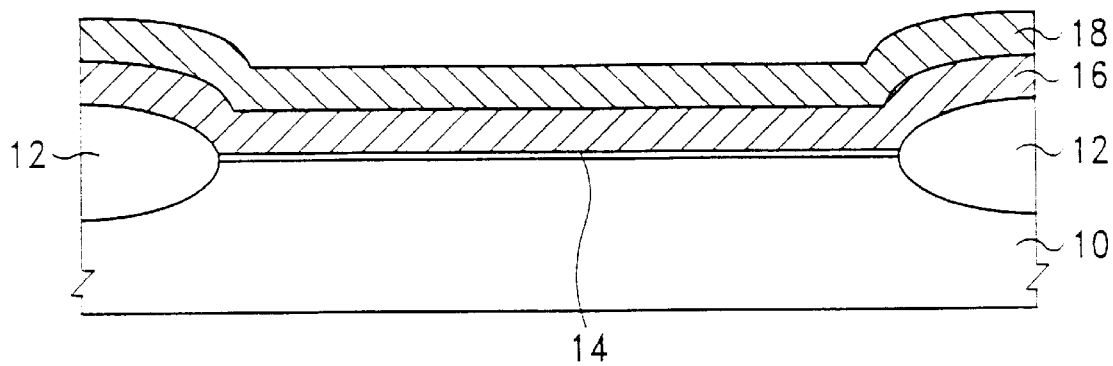
FIG. 1 illustrates a cross-sectional view of the formation of a gate insulator layer, a first silicon layer, and an anti-reflection layer over the semiconductor substrate in the present invention.

The method and the steps in the present invention applied on a semiconductor wafer can create different types of transistors and numerous devices at a time. For a clear illustration, the steps for forming mainly a single PMOS transistor are illustrated. Since the variations in the processes for incorporating the formation of the other types of transistors are well-known in the art, the details are not described. Referring to FIG. 1, a semiconductor substrate 10 with a preferable single crystalline silicon in a <100> direction is provided. An isolation region using field oxide isolation 12 or other isolation technology like trench isolation (not shown) is formed on the semiconductor substrate 10. A gate insulator layer 14, like an oxide layer, is formed. The oxide layer 14 can be grown thermally in an oxygen containing ambient. The oxide layer 14 is grown from the semiconductor substrate 10 with a thickness ranging from about 15 angstroms to 300 angstroms.

A first silicon layer 16 is then formed over the oxide layer 14. Preferably, an undoped polysilicon layer can be deposited as the first silicon layer 16. The undoped polysilicon layer 16 can be formed by chemical vapor deposition with a thickness of about 300 angstroms to 2000 angstroms. The forming of the undoped polysilicon layer 16 subsequently over the oxide layer 14 eliminates the problem of the oxide degradation from the penetration of ions. An anti-reflection layer 18 is formed over the undoped polysilicon layer. The anti-reflection layer 18 effectively reduces the unwanted reflections in the lithography process and increases the accuracy of the pattern transfer. One choice of the anti-reflection layer 18 is a nitride layer formed by a chemical vapor deposition process. The anti-reflection characteristic of the nitride layer 18 is nominated in the work of T. P. Ong et al. ("CVD SiNx Anti-reflective Coating for Sub-0.5 μm Lithography", 1995 Symposium on VLSI Technology Digest of Technical Papers.) The integration of a LPCVD (low pressure chemical vapor deposition) silicon-rich nitride film as a bottom anti-reflective coating (BARC) is recommended in their work. Their integration has been successfully demonstrated for deep-UV lithography with the details proposed in the article.

Figure 2:
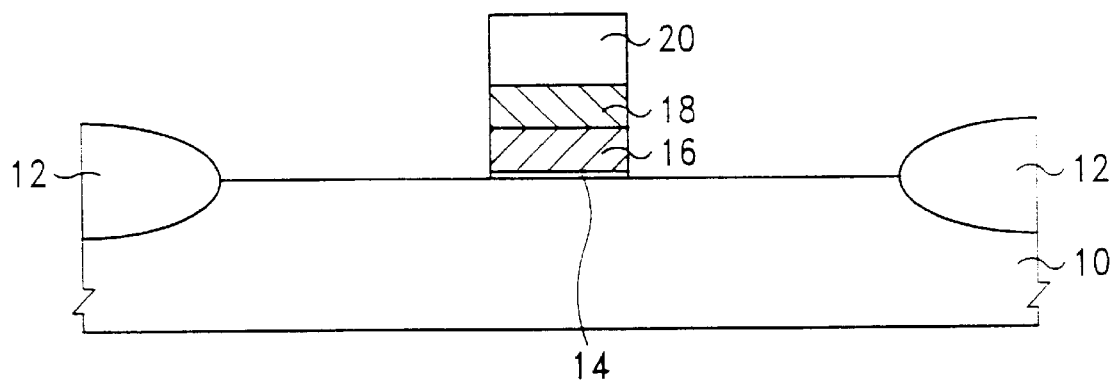
FIG. 2 illustrates a cross-sectional view of defining a gate region over the semiconductor substrate in the present invention.
Figure 3:
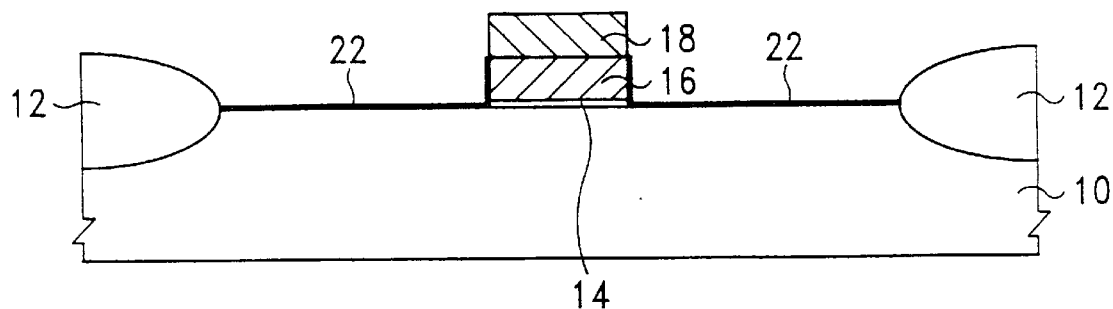
FIG. 3 illustrates a cross-sectional view of the formation of a shield layer over the semiconductor substrate, on the gate insulator layer, and on the first silicon layer in the present invention.

A gate region is formed by a series of steps to remove a portion of the oxide layer 14, of the undoped polysilicon layer 16, and of the nitride layer 18, as shown in FIG. 2. A lithography and an etching process can be applied in doing the work. A photoresist layer 20 is formed and patterned for defining a gate pattern. The oxide layer 14, the undoped polysilicon layer 16, and the nitride layer 18 can be sequentially removed with a reactive ion etching (RIE) under the generation of plasma, using the gate pattern as a mask. The photoresist layer 20 is then removed after the gate region is defined.

A shield layer 22 is formed to recover the etching damage on the surface of the semiconductor substrate 10. The shield layer 22 is formed over the semiconductor substrate 10, around the sidewall of the oxide layer 14 and of the undoped polysilicon layer 16. The shield layer 22 covering the oxide layer 14 can further reduce the penetration of undesired contamination into the oxide layer 14. The degradation of the oxide layer 14 which damages device performance can be minimized. In this case, an oxynitride film thermally grown from the semiconductor substrate 10 and the undoped polysilicon layer 16 in a nitrogen and oxygen containing gas ambient, like a $N_2O$ or NO ambient, is used. The oxynitride film 22 is also grown around the oxide layer 14 by the diffusion of silicon through the oxide layer 14 from the semiconductor substrate 10. The thin oxynitride film can be grown with an ultra-thin thickness between about 5 angstroms to 100 angstroms.

Figure 4:
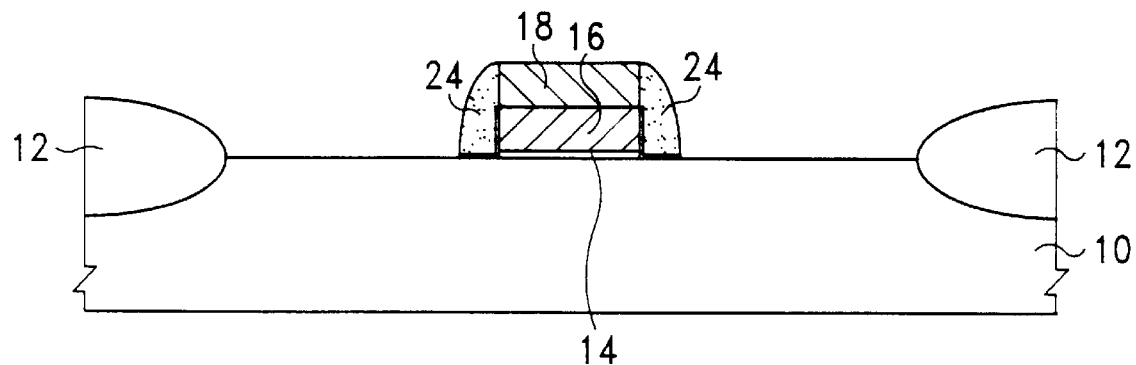
FIG. 4 illustrates a cross-sectional view of the formation of a spacer structure on the gate region in the present invention.
Figure 5:
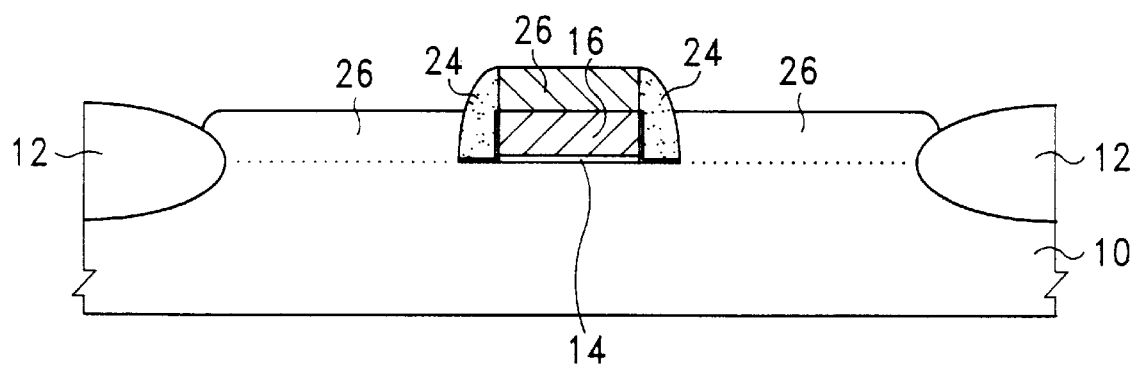
FIG. 5 illustrates a cross-sectional view of forming a second silicon layer over the semiconductor substrate and the first silicon layer in the present invention.

Referring to FIG. 4, a series of steps can be employed in forming a spacer structure 24 on the gate region. The spacer structure 24 is formed with first type dopants contained within. In the present embodiment, a boron containing oxide or a boron-doped glass (BSG) can be used as the spacer structure 24. A BSG layer is deposited and etched off to form the BSG spacers. The doping concentration in the BSG spacers 24 is about $5E19$ atoms/cm$^3$ to about $5E22$ atoms/cm$^3$. A portion of the oxynitride film 22 uncovered by the BSG spacers 24 is also removed during the etching process. Followed with the formation of the BSG spacers 24, the nitride layer 18 within the BSG spacers 24 is removed, or etched off. Referring to FIG. 5, a second silicon layer 26 is formed over the semiconductor substrate 10 and the undoped polysilicon layer 16, with second type dopants contained within. Preferably, a boron doped silicon layer is employed. The boron doped silicon layer 26 can be formed in a chemical vapor deposition (CVD) with the introduction of boron containing gases. Preferably, a UHV (ultra high vacuum) CVD process is employed. The doping concentration in the doped silicon layer 26 is about $5E19$ atoms/cm$^3$ to about $5E22$ atoms/cm$^3$.

A portion of the boron doped silicon layer 26 within the spacer structure 24 is combined with the undoped polysilicon layer 16 to form a stacked gate structure. The conductivity of the gate structure can be maintained with the boron doped silicon layer 26. The degradation of the oxide layer 14 can be prevented by eliminating the possible boron penetration. Finally, a thermal process is performed to the semiconductor substrate. The boron dopants in the boron doped silicon layer 26 and the BSG spacers 24 are diffused to form respectively an ultra-shallow source/drain junction 28 and an extended source/drain junction 30, as shown in FIG. 6.

The details of the silicon-boron layer as a solid diffusion source can be acquired by referencing the investigation of T.

F. Lei et al. ("Low-Temperature Growth of Silicon-Boron Layer as Solid Diffusion Source for Polysilicon Contacted p$^+$-n Shallow Junction", IEEE Transactions on Electron Devices, Vol. 42, No. 12, 1995) In this work, it is set forth that the silicon-boron source diode has a much shallower junction and is less sensitive to thermal budget than the BF2$^+$ source diodes. A uniform ultra-shallow p$^+$-n junction can be obtained by using a thin silicon-boron layer as a diffusion source in their investigation.

Figure 6:
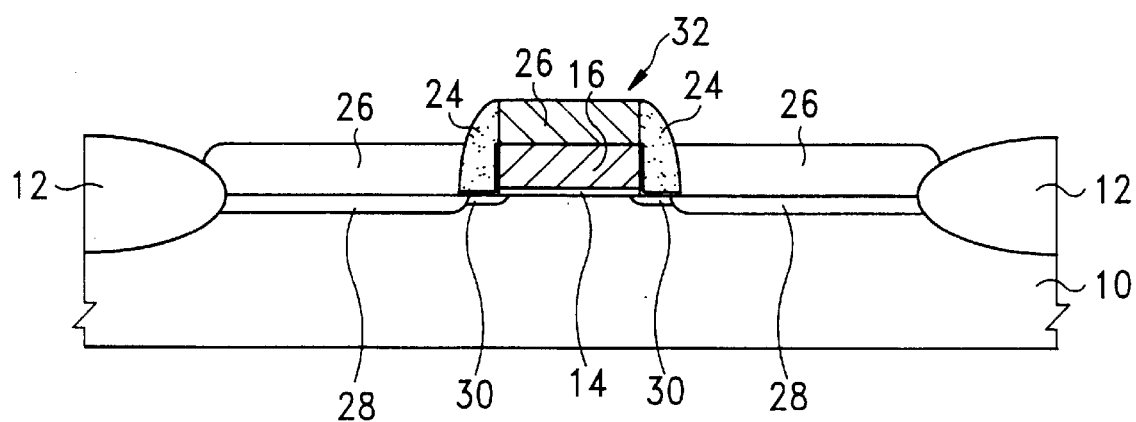
FIG. 6 illustrates a cross-sectional view of performing a thermal process to diffuse the dopants into the semiconductor substrate in the present invention.

Turning to FIG. 6, the elevated source/drain MOSFET (metal oxide semiconductor field effect transistor) with solid phase diffused source/drain extension is provided in the present invention. The MOSFET has a stacked gate structure 32 which has a first silicon layer 16, a second silicon layer 26, and a spacer structure 24. The first silicon layer 16 is formed over the semiconductor substrate 10. The second silicon layer 26 contains second type dopants and is formed on the first silicon layer. The spacer structure 24 containing first type dopants is formed on the sidewall of the first silicon layer 16 and the second silicon layer 26. A gate insulator layer is formed between the first silicon layer 16 and the semiconductor substrate 10. The second silicon layer 26 is also formed on the semiconductor substrate 10 at a region uncovered by the stacked gate structure 32. A junction region 28 is formed in the semiconductor substrate 10 under the second silicon layer 26 but not under the stacked gate structure 32. An extended junction region 30 is formed in the semiconductor substrate 10 under the spacer structure 24.

Figure 7:
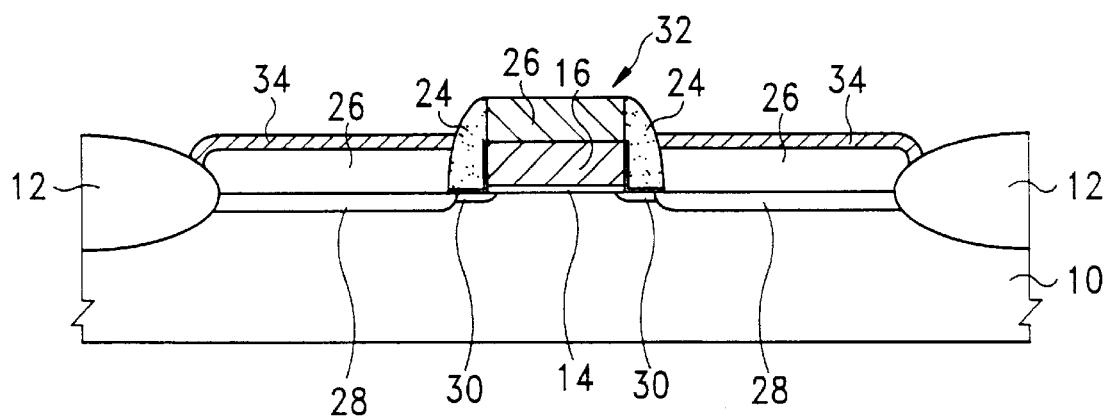
FIG. 7 illustrates a cross-sectional view of forming a metal silicide layer on the second silicon layer in the present invention.

With the structure disclosed above, a step of forming contact plugs in the metallization process can be performed to connect electrically with the first silicon layer 16 and the junction region 28. The contact plugs can be formed onto the second silicon layer 26 without the risk of damaging the junction region 28. Besides, a step of forming metal silicide layer 34 on the second silicon layer 26 can also be added optionally without influencing the depth of the junction region 28, as shown in FIG. 7.

A MOSFET with an elevated source/drain and solid phase diffused source/drain extension is disclosed. The method of forming the MOSFET is also provided. An elevated source/drain junction is formed with an ultra-shallow and uniform size by employing the boron doped silicon layer as a diffusion source. The short channel effects are greatly suppressed by using the elevated shallow junction. A stacked silicon layer structure is utilized as the gate structure to solve the problem of the degradation of the gate oxide. Thus, the operational characteristics of the devices can be raised. An extended ultra-shallow source/drain junction is formed by using the BSG spacers as a diffusion source. The unwanted effects accompanying the narrowed channel region of the small size devices are eliminated by the extended ultra-shallow junction.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A transistor on a semiconductor substrate, said transistor comprising:
   a stacked gate structure over said semiconductor substrate, said stacked gate structure comprising:
   a first silicon layer over said semiconductor substrate;
   a second silicon layer containing second type dopants over said first silicon layer; and
   a spacer structure containing first type dopants on sidewall of said first silicon layer and said second silicon layer;
   a gate insulator layer between said first silicon layer and said semiconductor substrate;
   said second silicon layer on said semiconductor substrate at a region uncovered by said stacked gate structure;
   a junction region in said semiconductor substrate under said second silicon layer but not under said stacked gate structure; and
   an extended junction region in said semiconductor substrate under said spacer structure.

2. The transistor of claim 1 further comprising a metal silicide layer on said second silicon layer.

3. The transistor of claim 1, wherein said semiconductor substrate comprises a silicon substrate.

4. The transistor of claim 1, wherein said gate insulator layer comprises an oxide layer which is thermally grown in an oxygen containing ambient from said semiconductor substrate with a thickness of about 15 angstroms to 300 angstroms.

5. The transistor of claim 1, wherein said first silicon layer comprises an undoped polysilicon layer deposited with a thickness of about 300 angstroms to 2000 angstroms.

6. The transistor of claim 1, wherein said spacer structure comprises BSG.

7. The transistor of claim 1, wherein said first type dopants comprise boron containing dopants at a dose of about 5E19 atoms/cm$^3$ to about 5E22 atoms/cm$^3$.

8. The transistor of claim 1, wherein said second silicon layer comprises boron doped silicon.

9. The transistor of claim 7, wherein said boron doped silicon is deposited with a selective epitaxial process.

10. The transistor of claim 1, wherein said second type dopants comprise boron containing dopants at a dose of about 5E19 atoms/cm$^3$ to about 5E22 atoms/cm$^3$.

11. The transistor of claim 1, wherein said junction region is formed by diffusing said second type dopants in said second silicon layer into said semiconductor substrate.

12. The transistor of claim 1, wherein said extended junction region is formed by diffusing said first type dopants in said spacer structure into said semiconductor substrate.

13. A transistor on a semiconductor substrate, said transistor comprising:
   a stacked gate structure over said semiconductor substrate, said stacked gate structure comprising:
   a first silicon layer over said semiconductor substrate;
   a second silicon layer containing second type dopants over said first silicon layer, said second silicon layer being a boron doped silicon layer; and
   a spacer structure containing first type dopants on sidewall of said first silicon layer and said second silicon layer, said spacer structure being BSG spacers;
   a gate insulator layer between said first silicon layer and said semiconductor substrate;
   said second silicon layer on said semiconductor substrate at a region uncovered by said stacked gate structure;

a junction region in said semiconductor substrate under said second silicon layer but not under said stacked gate structure; and an extended junction region in said semiconductor substrate under said spacer structure.

14. The transistor of claim 13 further comprising a metal silicide layer on said second silicon layer.

15. The transistor of claim 13, wherein said gate insulator layer comprises an oxide layer which is thermally grown in an oxygen containing ambient from said semiconductor substrate with a thickness of about 15 angstroms to 300 angstroms.

16. The transistor of claim 13, wherein said first silicon layer comprises an undoped polysilicon layer which is deposited with a thickness of about 300 angstroms to 2000 angstroms.

17. The transistor of claim 13, wherein said first type dopants comprise boron containing dopants at a dose of about 5E19 atoms/cm$^3$ to about 5E22 atoms/cm$^3$.

18. The transistor of claim 13, wherein said boron doped silicon is deposited with a selective epitaxial process.

19. The transistor of claim 13, wherein said second type dopants comprise boron containing dopants at a dose of about 5E19 atoms/cm$^3$ to about 5E22 atoms/cm$^3$.

20. The transistor of claim 13, wherein said junction region is formed by diffusing said second type dopants in said second silicon layer into said semiconductor substrate.

21. The transistor of claim 13, wherein said extended junction region is formed by diffusing said first type dopants in said spacer structure into said semiconductor substrate.

* * * * *